(12) United States Patent
Ohba et al.

(10) Patent No.: US 7,228,512 B2
(45) Date of Patent: Jun. 5, 2007

(54) METHOD OF GENERATING CAPACITANCE VALUE RULE TABLE FOR EXTRACTION OF WIRING CAPACITANCE AND CAPACITANCE VALUE RULE TABLE GENERATION PROGRAM

(75) Inventors: Hisayoshi Ohba, Kawasaki (JP); Jun Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 372 days.

(21) Appl. No.: 10/898,982

(22) Filed: Jul. 27, 2004

(65) Prior Publication Data

US 2005/0183049 A1     Aug. 18, 2005

(30) Foreign Application Priority Data

Feb. 12, 2004  (JP) .............................. 2004-035698

(51) Int. Cl.
*G06F 17/50*  (2006.01)
(52) U.S. Cl. .................................. 716/5; 716/3; 716/4
(58) Field of Classification Search .................... 716/5, 716/4, 3
See application file for complete search history.

(56) References Cited

U.S. PATENT DOCUMENTS

| | | | | |
|---|---|---|---|---|
| 4,680,220 A | * | 7/1987 | Johnson | 442/232 |
| 4,924,701 A | * | 5/1990 | Delatorre | 73/152.52 |
| 5,045,819 A | * | 9/1991 | Balanis et al. | 333/1 |
| 7,081,673 B2 | * | 7/2006 | Hedrick et al. | 257/751 |

FOREIGN PATENT DOCUMENTS

| | | |
|---|---|---|
| JP | 2002-299456 | 10/2002 |
| JP | 2002-368088 | 12/2002 |

* cited by examiner

*Primary Examiner*—Sun James Lin
(74) *Attorney, Agent, or Firm*—Staas & Halsey LLP

(57) ABSTRACT

A method and computer program for generating a capacitance value rule table, which simplifies generation of the capacitance value rule table for multilayer wiring having a complex dielectric constant structure are provided. In the method, construction data of wire adjacent to a wire of interest is extracted (S30), a common dielectric constant for a plurality of insulating film in the construction data is calculated (S32), and capacitance value rule table (F12) is created based on the common dielectric constant (s34).

13 Claims, 18 Drawing Sheets

FIG. 8

| Subject RLC | Matching data | RLC value | Calculation formula |
|---|---|---|---|
| Ca | Lj: d1<br>d2<br>-<br>dn | Ca=xx (F/$\mu$ m$^2$)<br>Ca=yy<br>—<br>Ca=zz | Ca × W × La |
| Cc | Lj: s1<br>s2<br>-<br>sn | Cc=xx (F/$\mu$ m)<br>Cc=yy<br>—<br>Cc=zz | Cc × La |
| Cf | Lj: sp1<br>sp2<br>-<br>spn | Cf=xx (F/$\mu$ m)<br>Cf=yy<br>—<br>Cf=zz | Cf × La |
| Cv | Lj: sp1<br>sp2<br>-<br>spn | Cv=xx (F/$\mu$ m)<br>Cv=yy<br>—<br>Cv=zz | Cv × La |
| Cd | Lj: d1<br>d2<br>-<br>dn | Cd=xx (F/$\mu$ m)<br>Cd=yy<br>—<br>Cd=zz | Cd × La |
| R | L1<br>L2<br>-<br>Ln | Rs=xx ($\Omega$/m$^2$)<br>Rs=yy<br>—<br>Rs=zz | Rs × La × W |
| L | L1<br>L2<br>-<br>Ln | Ls=xx (H)<br>Ls=yy<br>—<br>Ls=zz | Ls × La |

(PRIOR ART)     Segment SG2

(PRIOR ART)              Segment SG3

FIG. 16A
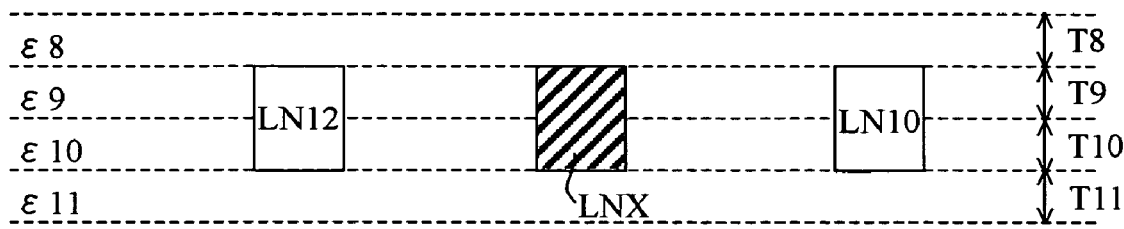
FIG. 16B
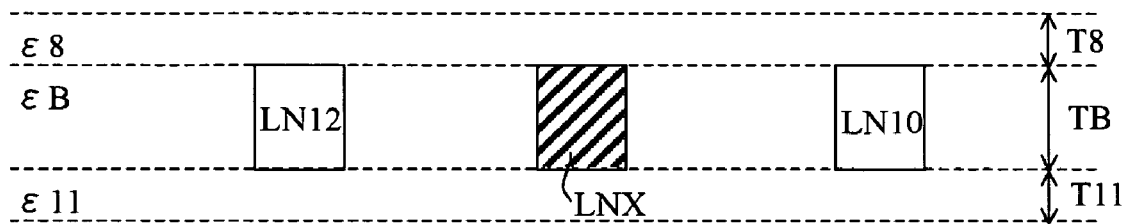

FIG. 18A
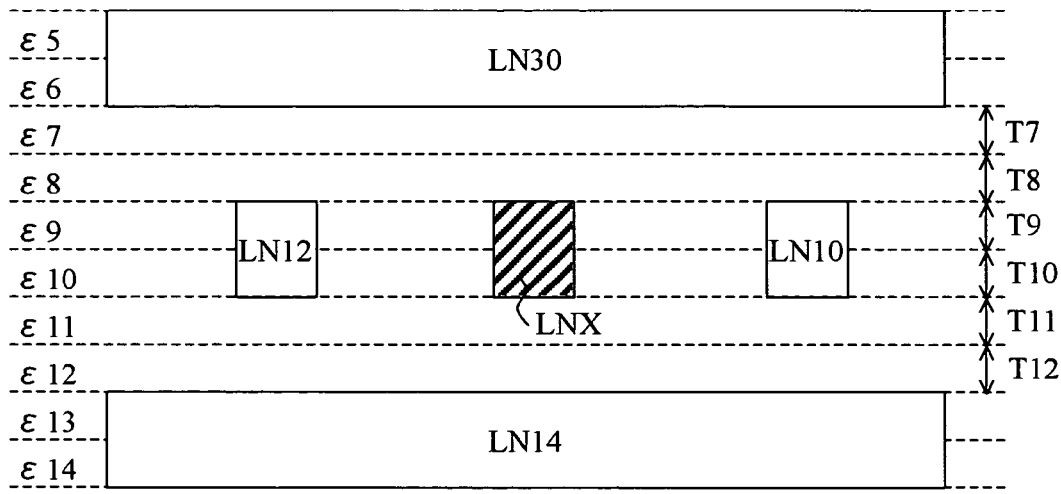
FIG. 18B
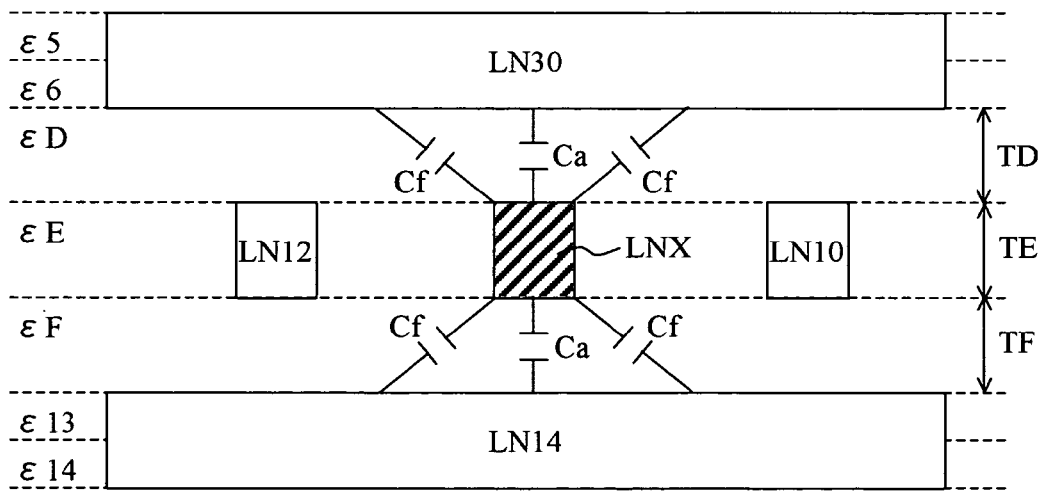

METHOD OF GENERATING CAPACITANCE VALUE RULE TABLE FOR EXTRACTION OF WIRING CAPACITANCE AND CAPACITANCE VALUE RULE TABLE GENERATION PROGRAM

CROSS-REFERENCE TO RELATED APPLICATIONS

This application is based upon and claims the benefit of priority from the prior Japanese Patent Application No. 2004-035698, filed on Feb. 12, 2004, the entire contents of which are incorporated herein by reference.

BACKGROUND OF THE INVENTION

1. Field of the Invention

This invention relates to a method and computer program for generation of a capacitance value rule table for extraction of the wiring capacitance of an LSI device, and in particular to a method and computer program capable of rapid generation of a capacitance value rule table to be referenced when extracting the wiring capacitance of multilayer wiring having a complex structure of dielectric constant.

2. Description of the Related Art

LSI device design processes are normally performed with CAD executed by a computer. LSI device design processes include a logic design process to design the logic circuitry connecting logic gates; a layout design process to lay out the logic circuitry on an actual chip; a process to extract RLC values (resistances, inductances, capacitances) of the layout interconnects from the layout data, and to determine delay times for each signal path from the extracted RLC values and from cell and macro AC characteristics; a timing verification (logic verification) process to check whether, using these delay times, the logic circuit operates normally; and a physical verification process to check, based on the layout data, whether design rules are satisfied. Through layout design, the layout data including wiring pattern data for each layer on the chip is created, and based on this layout data the RLC values for interconnects are extracted. An RLC extraction process, delay time calculation process, and logic simulation process are generally provided by a single program module.

In the above RLC extraction process, the resistances R, capacitances C and inductances L of interconnects are extracted, referencing the RLC rule table, according to the widths of wires contained in the layout data, the distances between neighboring wires, overlap areas and similar. That is, a rule table having RLC values for interconnects determined according to wire distances and other parameters is generated in advance from LSI process rules which specify the multilayer wiring structure, and when RLC values are extracted for interconnects in the actual layout, the parameters of actual interconnects are matched with the parameters of the RLC rule table, and RLC values corresponding to matching parameters are extracted from the rule table. Such an RLC value extraction method has for example been disclosed in Japanese Patent Laid-open No. 2002-368088 (FIG. 1 and FIG. 12, for example).

As another RLC extraction method, it has been proposed that capacitance values be computed in an adjacent wiring structure of actual interconnects based on layout data, as for example in Japanese Patent Laid-open No. 2002-299456.

SUMMARY OF THE INVENTION

An object of this invention is to provide a method and computer program for generating a capacitance value rule table, which simplifies generation of the capacitance value rule table for multilayer wiring having a complex dielectric constant structure.

In order to achieve the above object, a first aspect of this invention is a method of generating a capacitance value rule table having, according to parameters including adjacent wire distances, capacitance value data for wires in a multilayer wiring structure in which provided are a plurality of wiring layers in a structure of a plurality of insulating films having different dielectric constants, said method comprising:

a step of extracting data of adjacent wiring structure for a wire of interest;

a common dielectric constant generation step of calculating a common dielectric constant for the plurality of insulating films included in said adjacent wiring structure, by adding the dielectric constants of the plurality of insulating films according to thickness of the respective insulating film; and, a step of generating said capacitance value rule table by calculating capacitance value data corresponding to said parameters according to the calculated common dielectric constant.

In a more preferred embodiment of the above first aspect of the invention, the above process of extracting adjacent wiring structure data is characterized in that data is extracted for the plurality of insulating films existing between said wire of interest and wires adjacent laterally or vertically thereto.

In order to achieve the above object, a second aspect of this invention is a method of generating a capacitance value rule table having, according to parameters including adjacent wire distances, capacitance value data for wires in a wiring structure in which provided are a plurality of wires in an insulating film structure, wherein said wiring structure has a floating dummy pattern between adjacent wires in a horizontal direction; and said generating method comprises:

a step of extracting data of adjacent wiring structure for a wire of interest;

a common dielectric constant generation step of calculating a common dielectric constant for areas between said adjacent wires in the horizontal direction included in said adjacent wiring structure, by adding the dielectric constants of insulating films and dummy dielectric constant assigned to said dummy pattern according to widths of said insulating films and said dummy pattern; and, a step of generating said capacitance value rule table by calculating capacitance value data corresponding to said parameters according to the calculated common dielectric constant.

By means of the first aspect of the invention, after calculating the common dielectric constant and simplifying the dielectric constant structure for a plurality of dielectric constant structures having different dielectric constants in a multilayer wiring structure, capacitance values corresponding to parameters of adjacent wire distance are calculated according to the common dielectric constant, so that through computations similar to those for an insulating film structure comprising a single dielectric constant, capacitance values corresponding to each parameter can easily be calculated.

By means of the second aspect of the invention, even when a dummy pattern is provided between wires, the dielectric constant structure in a wiring layer is simplified and the common dielectric constant is calculated after substitution of a dummy dielectric constant, so that using this common dielectric constant, capacitance values can be calculated simply according to distances between wires.

BRIEF DESCRIPTION OF THE DRAWINGS

FIG. 8 shows one example of an RLC rule table of this aspect;

FIG. 16 is a drawing to explain another method of simplification of the dielectric constant structure corresponding to adjacent wire capacitance values;

FIG. 18 is a drawing to explain another method of simplification of the dielectric constant structure corresponding to capacitances with wires above and below;

DESCRIPTION OF THE PREFERRED EMBODIMENTS

Figure 1:
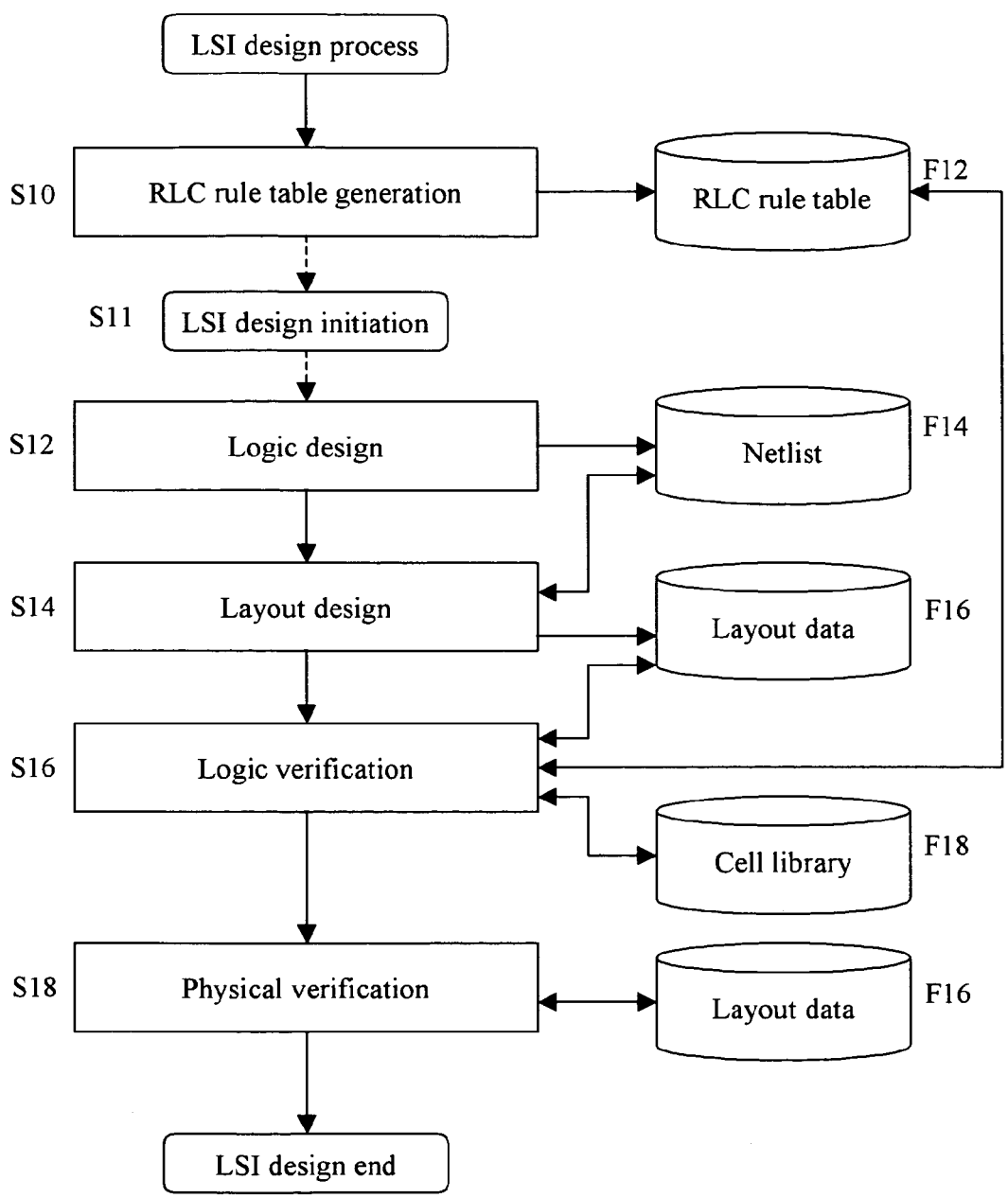
FIG. 1 is a flowchart showing an LSI design process of this aspect.

As LSI devices have become more finely processed in recent years, multilayer wiring structures have grown more complex and the insulating films between wiring and insulating film between wiring layers have shown more variety, so that LSI devices have come to include a plurality of insulating films having different dielectric constants. When multilayer wiring has such a dielectric constant structure, if an attempt is made to calculate the capacitances of a rule table from actual adjacent wiring structures based on layout data as in Japanese Patent Laid-open No. 2002-299456, the calculations become complex, and a vast amount of computer processing time is required.

On the other hand, if the RLC extraction method of Japanese Patent Laid-open No. 2002-368088 is used, RLC values in possible adjacent wiring structures are determined in advance in correspondence with parameters as a rule table, and it is only necessary to match the parameters of the rule table to the parameters of adjacent wiring structures of actual interconnects using the layout data, so that the amount of computer processing time can be greatly reduced.

However, in generating an RLC rule table in advance of the RLC extraction process, if an attempt is made to calculate capacitance values from adjacent wiring structures having complex dielectric constant structures, the calculations become extremely complex and a vast amount of computer processing time is required, similarly to Japanese Patent Laid-open No. 2002-299456.

Below, aspects of this invention are explained referring to the drawings. However, the technical scope of this invention is not limited to these aspects, but extend to the items described in the scope of claims and to items equivalent thereto.

FIG. 1 is a flowchart showing an LSI design process of this aspect. The LSI design process has as an initial preparatory stage an RLC rule table generation process S10 of calculating RLC values (resistances, inductances, capacitances) for wires, corresponding to distances of wires from adjacent wires, opposing areas and similar, based on process rules which identify a multilayer wiring structure. Process rules include data on the film thickness and material quality of each wiring layer, insulating film structures between wiring layers, insulating film structures within wiring layers and similar for the LSI multilayer wiring structure. Hence by referencing the process rules, RLC values for wires in possible adjacent wiring structures can be calculated in advance. An RLC rule table F12 generated in this preparatory stage is stored in storage means of a computer in the form of a data file. The method of generating this RLC rule table is described in detail below.

In this aspect, RLC values for wires are calculated; but except when extremely high-speed operation is performed, it is sufficient to calculate only resistance values R and capacitance values C directly related to delay characteristics.

Next, in the stage to design an individual LSI device after the LSI design initiation step S11, there are a logic design process (S12) to connect logic gates and design a logic circuit; a layout design process (S14) to perform layout on an actual chip of the logic circuit; a logic verification process (S16) to determine delay times for signal paths of wires in the layout and to check whether operation is normal in a logic circuit with the timing resulting from these delay times; and a physical verification process (S18) to check whether the layout data satisfies the design rules.

Figure 2:
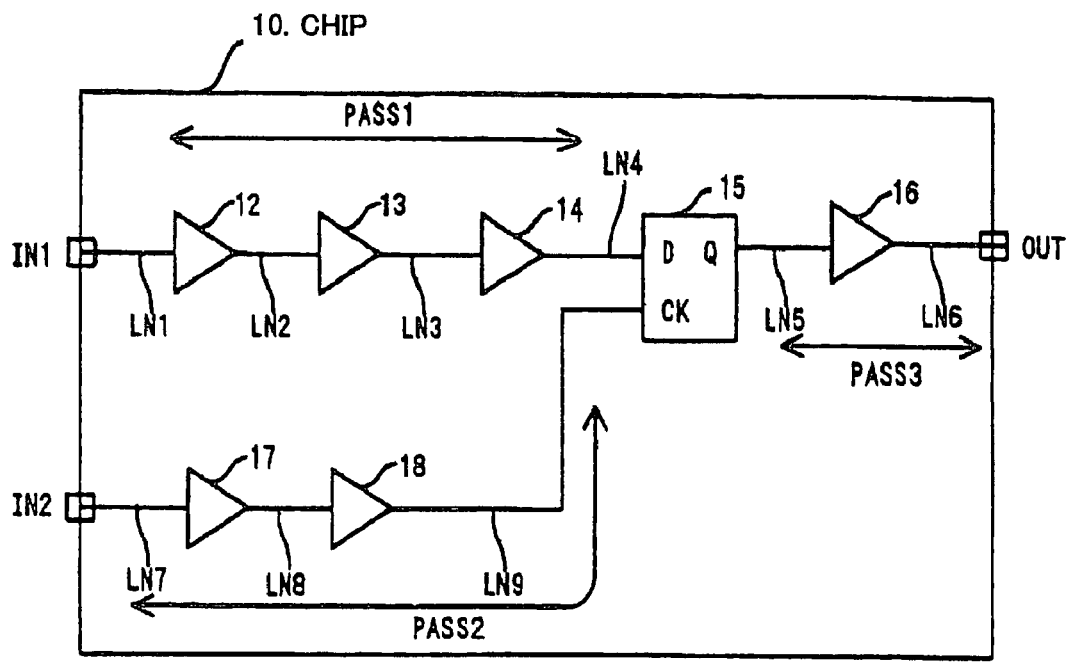
FIG. 2 shows one example of a logic circuit generated in logic design process.

In the logic design process S12, the designer uses a CAD tool for logic design to design a logic circuit which realizes fixed functions. As a result, a netlist F14 including cells and macros having logic gates and data for connections between these is generated. When the logic design process ends, a logic circuit such as that in FIG. 2 is completed. This logic circuit can be specified by the netlist F14. In the example of the logic circuit of FIG. 2, the gates 12 to 14 and 16 to 18 and the flip-flop 15 are connected between the input terminals IN1, IN2 and the output terminal OUT on the chip 10. These gates and flip-flop are connected by the interconnects LN1 to LN9 respectively.

After this logic design process, the layout design process S14 is performed. Here, cells and macros are positioned on an actual chip, and layout of interconnect patterns to connect these is performed, to generate the layout data F16. When interconnects are to be realized by multilayer wiring on the chip, layout data is generated for each interconnect layer. Hence taking the logic circuit of FIG. 2 as an example, the layout data F16 has data for the wiring patterns of the interconnects LN1 to LN9.

In the layout design process, in order to hold the pattern density as close to constant as possible for the layout data, dummy patterns are created in areas, where pattern densities are low due to comparatively long distance between adjacent wirings which extend in a single direction, to eliminate drops in pattern density. A conductive dummy pattern is normally in an electrically floating state, and in this respect differs from a wiring pattern. Such dummy patterns are discussed in detail below.

Figure 4:
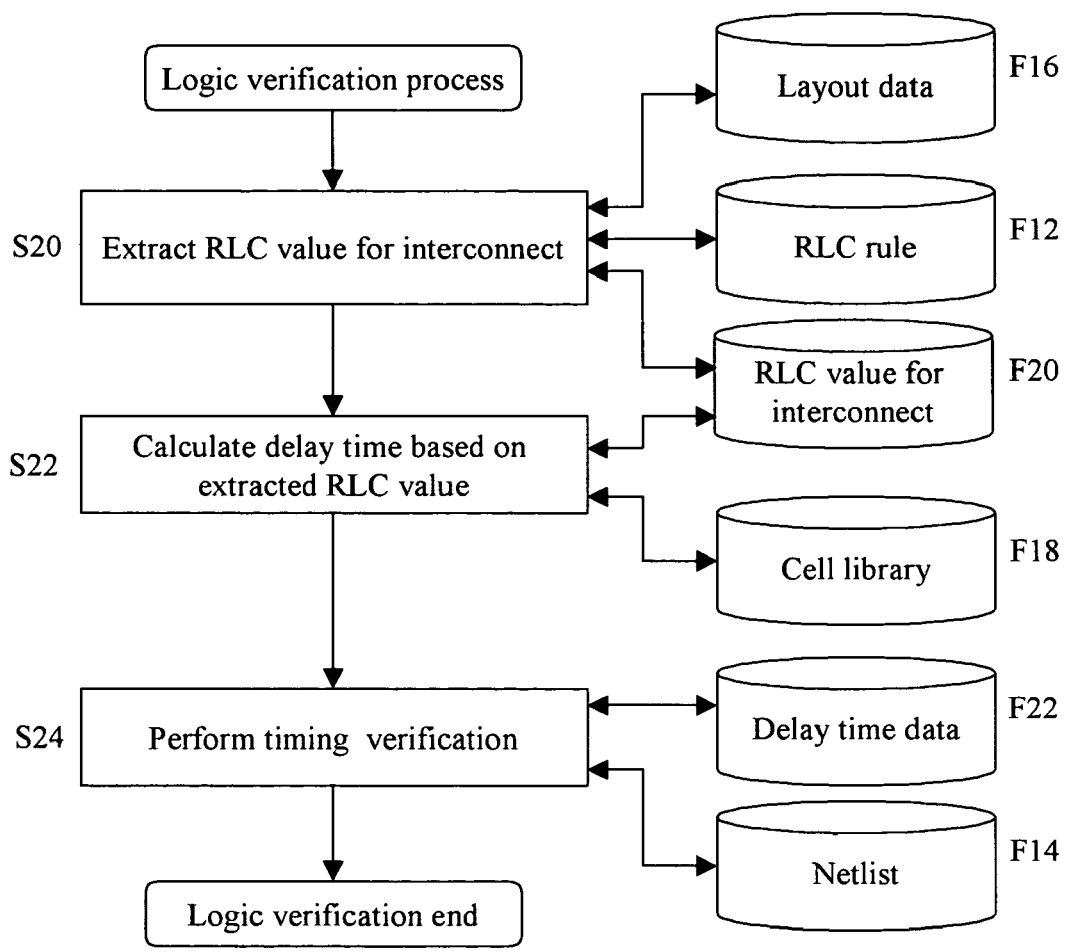
FIG. 4 is a flowchart of the logic verification process.

Then, the logic verification process (S16) is performed for the layout data F16. FIG. 4 is a flowchart of the logic verification process; the logic verification process is explained referring to this figure. First values of the resistance R and capacitance C, and as necessary the inductance L, are extracted for the interconnects LN1 to LN9, based on the layout data F16 (S20). In this RLC value extraction process, parameters in the RLC rule table F12 generated in the preparatory stage are matched with the parameters of a wire of interest, and RLC values corresponding to matching parameters are read from the RLC rule table F12. By referencing the RLC rule table, there is no need to calculate RLC values for a wire of interest each time based on the layout data, so that less computer processing time can be used.

Next, based on the extracted wire RLC value data and on the AC characteristics of cells and macros in the cell library F18, signal propagation delay times are calculated for the signal paths PASS1 to PASS3 (S22). The AC characteristics of the cells and macros are, for example, in the case of an inverter, a falling output for rising input, output driving capacity, and similar.

Figure 3:
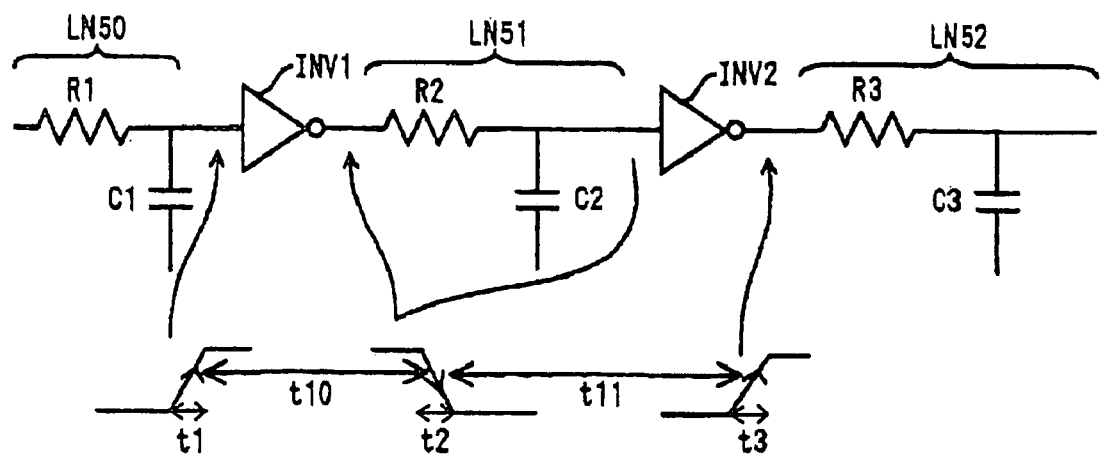
FIG. 3 is a drawing to explain calculation of signal propagation delay time on a signal path.

FIG. 3 is a drawing to explain calculation of signal propagation delay time on a signal path. In this example, the inverters INV1, INV2 are connected in series. In this case, an interconnect LN50 with resistance R1 and capacitance C1 is connected to the input terminal of the initial-stage inverter INV1. This interconnect LN50 is driven by a gate in the preceding stage, not shown, and the input signal to the inverter INV1 is a rising waveform with a delay time of t1. The delay time t1 of this rising waveform is calculated from the driving capacity of the preceding-stage gate and the resistance R1 and capacitance C1 and similar of the interconnect LN50.

In response to the rising waveform input to the inverter INV1, the output falls after a fixed delay time t10. The falling-output characteristic depends on the resistance R2 and capacitance C2 of the interconnect LN51 connected to the output terminal, and on the output driving characteristic of the inverter INV1. Similarly in the next-stage inverter INV2 also, in response to the falling-waveform input, the output rises after a fixed delay time t11. This output rising characteristic t3 likewise is determined by the driving capacity of the inverter INV2 and on the resistance R3 and capacitance C3 of the wire connected to the output.

In this way, signal propagation delay times can be calculated in order along the signal path from the RLC values of the interconnects and the cell AC characteristics. As a result, in the example of the logic circuit of FIG. 2, the signal propagation delay times for the signal paths PASS1, 2, 3 are determined. If the inductance of an interconnect is extracted, the resulting delay characteristic can also be reflected to the signal propagation delay time for the signal path.

When the signal propagation delay times for signal paths are obtained, timing verification (S24) is performed to check whether the logic circuit operates normally. In this timing verification, a check is performed to determine whether the logic circuit operates normally for test input data, and whether the expected test output data is output. In this case, the signal propagation delay times for signal paths determined above are used to check whether, in the example of FIG. 2, the clock input timing to the clock terminal CK of the flip-flop 15 coincides with the data input timing to the data input terminal D. That is, the data input D must be maintained at the correct level between the setup time and hold time around the leading edge of the clock CK. In order to perform this check, the delay times of the signal paths PASS1 and PASS2 must be calculated appropriately.

Figure 5:
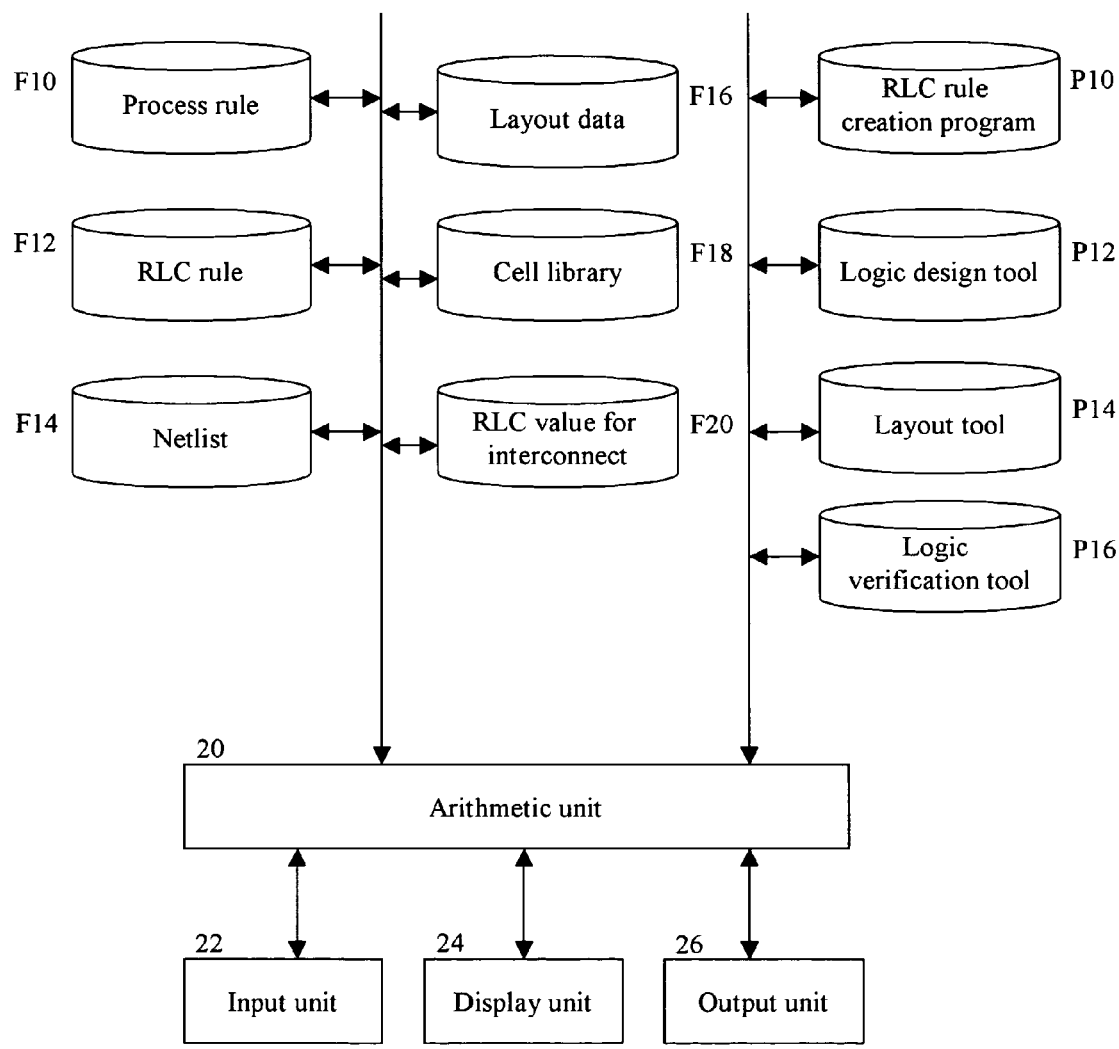
FIG. 5 shows the configuration of a computer system in this aspect.

FIG. 5 shows the configuration of a computer system in this aspect. In this computer system, a keyboard or other input unit 22, monitor or other display unit 24, and printing device or other output unit 26 are connected to a arithmetic unit 20. Further, a storage unit stores a process rule file F10 which specifies an LSI multilayer wiring structure, an RLC rule table file F12 in which are RLC values for wires calculated in the preparatory stage based on process rules, and corresponding to adjacent wire distances, opposing areas, and other parameters, a netlist file F14 generated in logic design, a layout data file F16 generated in layout design, a cell library file F18 having logic data and layout data for cells and macros included in an LSI device, an RLC value file F20 for interconnects extracted in the RLC extraction process, and other files, as well as an RLC rule creation program P10, logic design tool P12, layout tool P14, logic verification tool P16, and other programs.

The functions of the logic design tool P12, layout tool P14, and logic verification tool P16 are as explained above, and are not described in detail in this aspect. On the other hand, in the RLC rule creation program P10, the method of creation of a rule table for capacitance values C in particular is an essential portion of this aspect, and so is explained in detail below.

Figure 6:
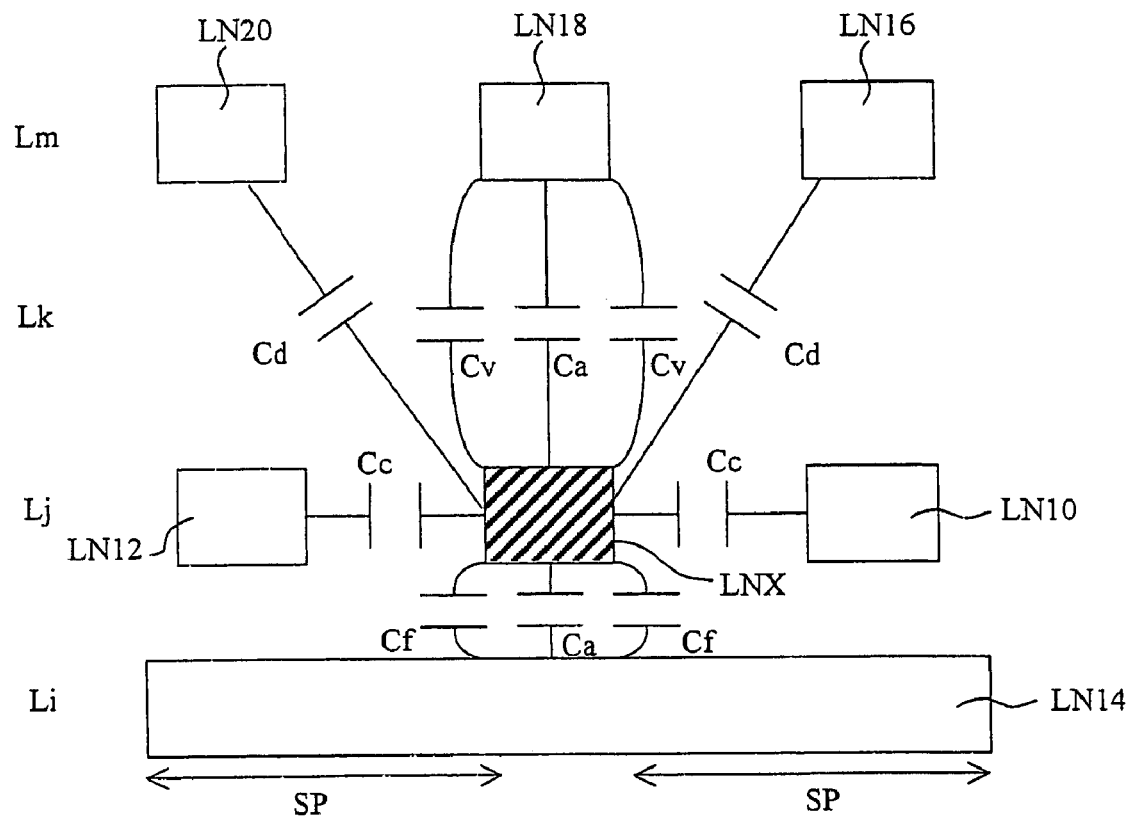
FIG. 6 shows the capacitances extracted in a typical multilayer wiring structure.

FIG. 6 shows the capacitances extracted in a typical multilayer wiring structure. In the example of FIG. 6, wires are provided in alternation in the X direction (the horizontal direction to the figure) and the Y direction (the vertical direction to the figure) in the four wiring layers Li, Lj, Lk, Lm; however, it so happens that wires are not provided in the wiring layer Lk. Taking the wire LNX in the wiring layer Lj as the wire of interest, there exists an adjacent wire capacitance Cc with the adjacent wires LN10 and LN12 in the same wiring layer Lj; there exist an area capacitance Ca and diagonal-direction fringe capacitances Cf with the adjacent wire LN14 in the lower wiring layer Li; there exist an area capacitance Ca and diagonal-direction fringe capacitances Cv with the adjacent wire LN18 immediately above the wire LNX in the upper wiring layer Lm; and there exist diagonal wire capacitances Cd with the wires LN16, LN20 adjacent in diagonal directions in the upper wiring layer Lm.

The area capacitances Ca can be calculated from the overlap area S of the opposing wire, the adjacent wire distance d, and the dielectric constant E of the insulating film between the wires, using Ca=∈S/d for the capacitance per unit length. For the adjacent wire capacitance (coupling capacitance) Cc, the capacitance per unit length is similarly found from the distance between wires d, the wire thickness, and the dielectric constant of the insulating film between the wires. The fringe capacitances Cf and Cv depend on the length sp and dielectric constant of the edge portion of the adjacent wire LN14. And, the diagonal wire capacitances Cd depend on the diagonal-direction distance d and dielectric constant.

Figure 7:
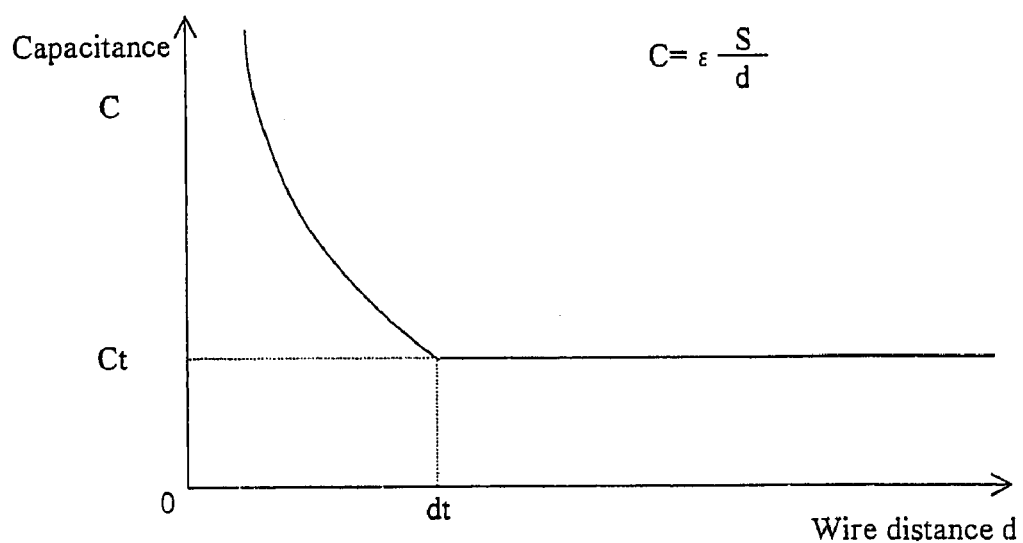
FIG. 7 is a graph showing the relation between wire distances d and capacitances C.

FIG. 7 is a graph showing the relation between wire distances d and capacitances C. Capacitances between wires. C and distances between wires d are in an inverse-proportional relationship, but when the distance between wires exceeds a prescribed distance dt, processing to compute the capacitance between wires C can be simplified by assigning a constant capacitance Ct.

FIG. 8 shows one example of an RLC rule table of this aspect. The RLC rule table has RLC values corresponding to parameters to be matched for each of the above capacitances Ca, Cc, Cf, Cv, Cd, resistances R, and inductances L. For example, in the case of an area capacitance Ca the parameters for matching are the wiring layer Lj of the wire of interest and the adjacent wire distances d, and capacitance Ca per unit area is acquired corresponding to different wiring layers (in the example of FIG. 8, only the wiring layer Lj is shown) and different distances d1, d2, . . . , dn from another layers. That is, the distance corresponding to an area capacitance of a wire of interest in actual layout data is compared with parameters d in the rule table, and the capacitance value Ca of the matching parameter is extracted from the rule table. Then, from the wire width W of the wire of interest and the length La of the segment of the wire of interest which is to be extracted, the area capacity Ca×W×La for the wire of interest is extracted.

In the case of adjacent wire capacitances Cc, if the wiring layer of the wire of interest is identified, the thickness and similar of the wire are identified, and so the parameters for matching are the wiring layer Lj of the wire of interest and the wire distance s, and the rule table has capacitances Cc per unit length corresponding to the wiring layer Lj and distances s1, s2, . . . , sn as parameters. Fringe capacitances Cf, Cv have as parameters for matching the wiring layer Lj and fringe length sp; diagonal-wire capacitances Cd have as parameters for matching the wiring layer Lj and distance thereto d.

Further, resistances R and inductances L correspond to the wiring layer of the wire of interest, so that the parameter for matching is the wiring layer. Resistances R in the rule table are resistances per unit cross-sectional area, so that computations are performed employing the width W and length La of the wire of interest.

Figure 9:
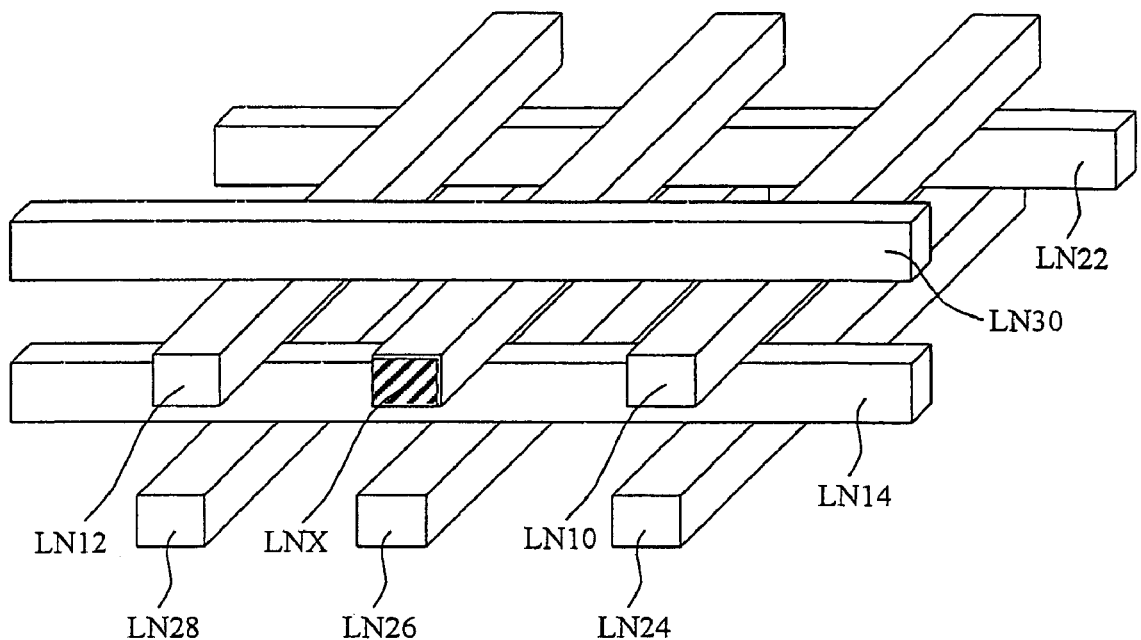
FIG. 9 is a perspective view showing one example of a multilayer wiring structure.
Figure 10:
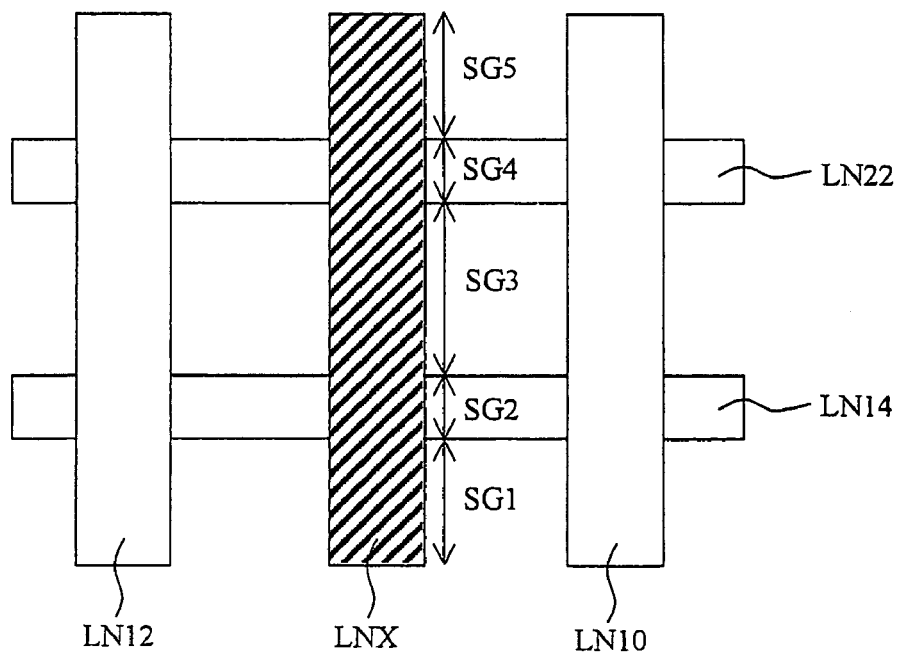
FIG. 10 is a plane view of FIG. 9.

FIG. 9 is a perspective view showing one example of a multilayer wiring structure; FIG. 10 is a plane view of same. In the perspective view of FIG. 9, an example of a four-layer multilayer wiring structure is shown. As explained above, wires are provided in alternation in the X and Y directions in wiring layers; however, wires are not provided densely in all wiring layers, and depending on the layout design, there may exist wiring layers in which wires are provided densely and wiring layers in which wires are not provided densely. The plane view of FIG. 10 is a view seen from above of the wiring layer with the wires LNX, LN10, LN12 in FIG. 9; only the wires LN14 and LN22 in the lower layer are seen. From this plane view it is clear that the cross-sectional structure differs in each of the five segments SG1-5 of the wire of interest LNX. That is, in the segments SG1, SG3, SG5 there exist no horizontal-direction wires above or below, but in the segment SG2 there exist horizontal-direction wires LN14, LN30 above and below, and in the segment SG4 there exists a horizontal-direction wire LN22 below.

Figure 11:
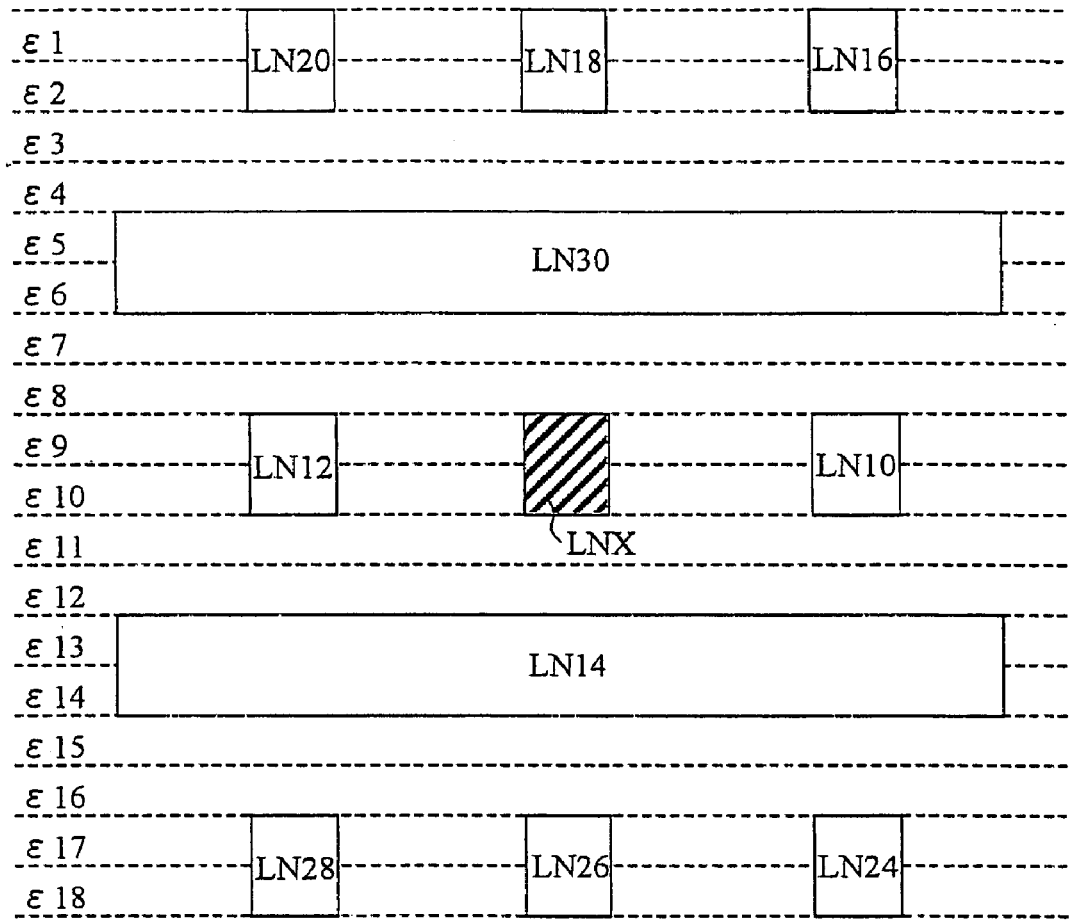
FIG. 11 is a cross-sectional view of segment SG2 of a wire of interest LNX.
Figure 12:
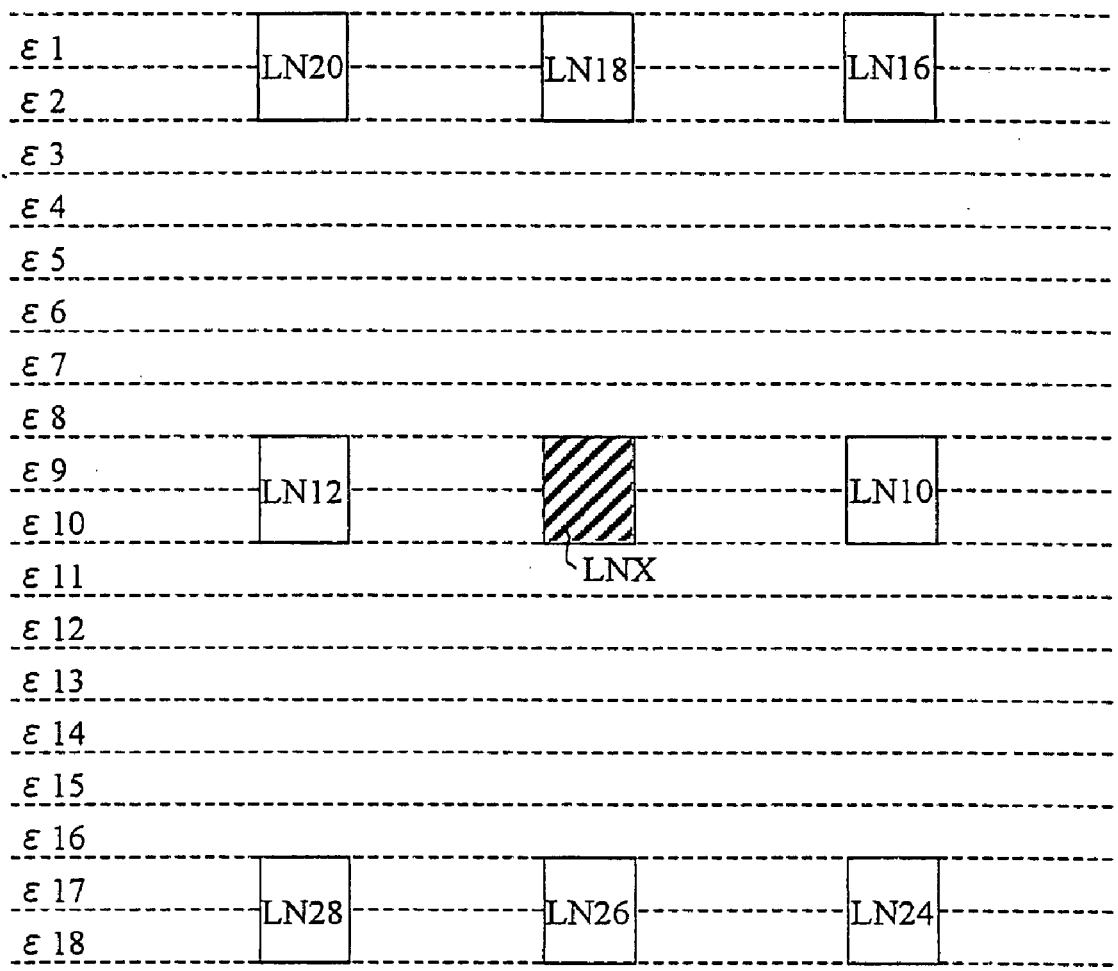
FIG. 12 is a cross-sectional view of segment SG3 of a wire of interest LNX.
Figure 13:
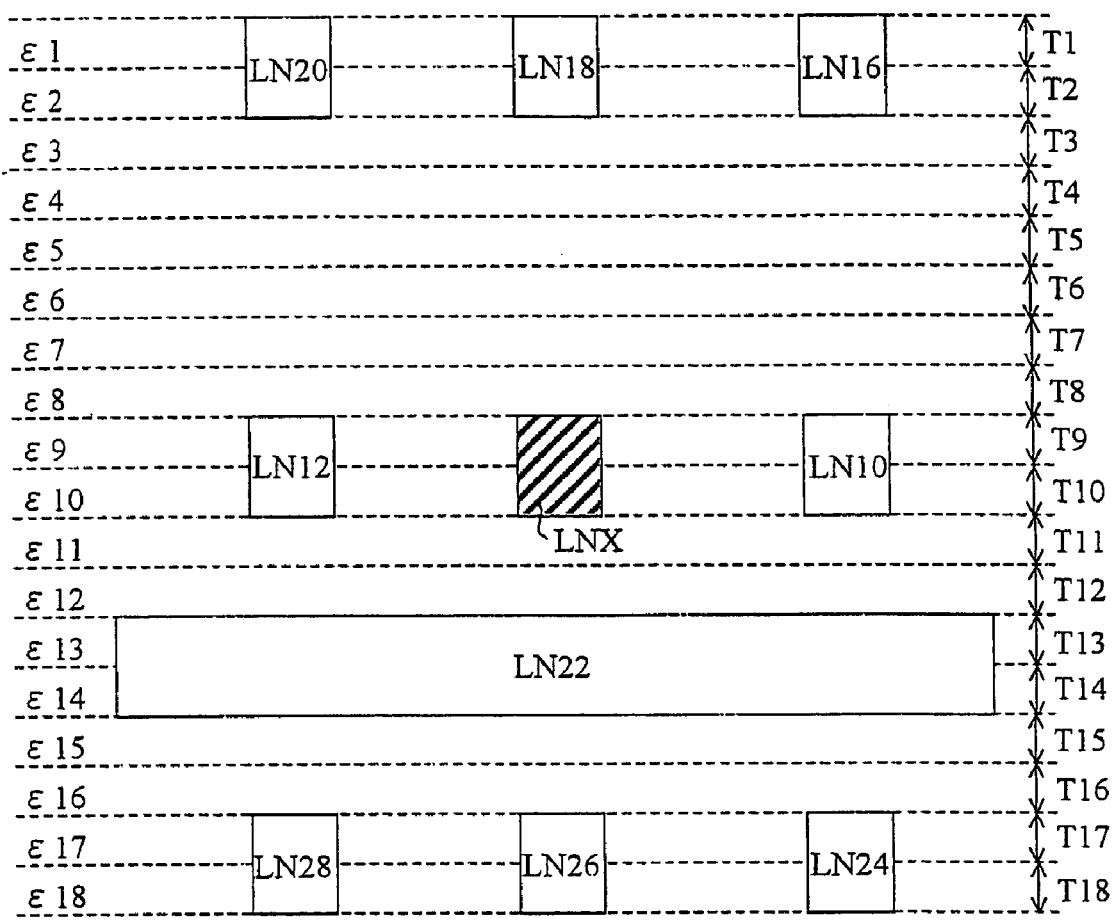
FIG. 13 is a cross-sectional view of segment SG4 of a wire of interest LNX.

FIG. 11 through FIG. 13 are cross-sectional views of the multilayer wiring structure. FIG. 11 is a cross-sectional view of segment SG2 of the wire of interest LNX. Wires LN10, LN12 are provided on either side of the wire of interest LNX, a wire LN30 is provided in the layer above, and wires LN16, LN18, LN20 are provided in the next layer above; a wire LN14 is provided in the layer below, and wires LN24, LN26, LN28 are provided in the next layer below. Insulating films between wiring layers are not necessarily single insulating films having single dielectric constants, but includes a plurality of insulating films having different dielectric constants ∈1 to ∈18 and different film thicknesses T1 to T18. In the example of FIG. 11, there are two insulating film layers between adjacent wiring layers, and spaces between wires in each wiring layer also have two insulating film layers; however, the number of layers in each case need not be two. The insulating film configuration within a multilayer wiring structure differs according to the process rules.

FIG. 12 is a cross-sectional view of segment SG3 of the wire of interest LNX. In this segment, no horizontal-direction wires are provided either above or below the wire of interest LNX, whereas in the layer above the wire of interest the vertical-direction wires LN16, LN18, LN20 are directly adjacent, and in the layer below the vertical-direction wires LN24, LN26, LN28 are directly adjacent.

FIG. 13 is a cross-sectional view of segment SG4 of the wire of interest LNX, and is the same as the cross-sectional view of FIG. 6. That is, horizontal-direction wires do not exist in the layer above the wire of interest LNX, but above this the wires LN16, LN18, LN20 are directly adjacent to the wire of interest. Otherwise the figure is the same as FIG. 11. In a case in which there exist no horizontal-direction wires in the layer below the wire of interest LNX but there are vertical-direction wires directly adjacent in the next layer below, the vertical relation is the opposite of that of FIG. 13.

In this way, when the cross-sectional structure in each segment is different for the same wire of interest, the capacitance structure formed with adjacent wires as a result is also different. Hence it is necessary to calculate and store in advance in an RLC rule table all the capacitance values for all possible cross-sectional structures, in correspondence with parameters.

FIG. 13 and FIG. 6 are contrasted to explain generation of a capacitance value rule file for a wire of interest. For example, there exist between the wire of interest LNX and the horizontal-direction adjacent wires LN10, LN12 two insulating film layers, with dielectric constants ∈9, ∈10 and film thicknesses T9, T10. Hence the adjacent wire capacitance Cc in FIG. 6 must be calculated taking these two insulating films into account. Similarly between the wire of interest LNX and the vertical-direction adjacent wire LN14 there exist two insulating film layers with dielectric constants ∈1, ∈12 and film thicknesses T11, T12. Hence the area capacitance Ca in FIG. 6 must be calculated taking these two insulating films into account. The other capacitances Cv, Cf, Cd must similarly be calculated taking into account the plurality of insulating films which exist between the wire of interest and wires adjacent thereto.

Due to the increased scales of LSI devices in recent years, multilayer wiring data has become more complex and voluminous, and consequently processing to compute capacitance values resulting from complicated insulating films as described above for all wires requires greater amounts of computer processing time and so is undesirable. Hence in this aspect, when the capacitance value rule table is created, first the plurality of dielectric constant structures are simplified according to the dielectric constants, film thicknesses in the dielectric constant structure, distances between the wire of interest and either its adjacent wires or surrounding wires, and similar. Specifically, the plurality of insulating films between the wire of interest and adjacent wires are unified to calculate a common dielectric constant, and the structure of the plurality of insulating films is simplified. After this process to simplify the insulating film structure, the simplified common dielectric constant is employed to generate a capacitance value rule table for a model configured as though wires are provided in a single insulating film. As a result, the amount of computer processing involved in the RLC rule table creation process is reduced, and the processing time can be shortened. The specific method used is explained below.

Figure 14:
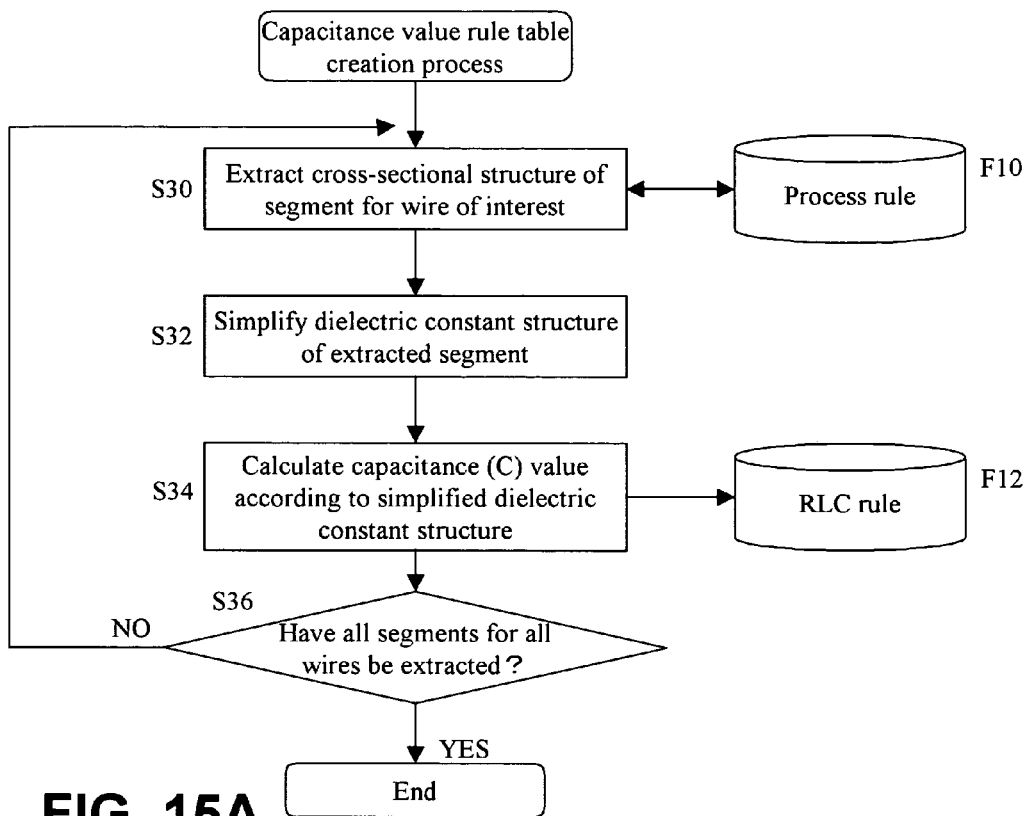
FIG. 14 is a flowchart of the capacitance value rule table creation process of this aspect.

FIG. 14 is a flowchart of the capacitance value rule table creation process of this aspect. The capacitance value for a wire of interest differs according to the structure of the surrounding adjacent wiring, and so the cross-sectional structure of a segment of the wire for which capacitance values are to be extracted is extracted from the process rules F10 (S30). That is, in the above-described multilayer wiring structure of FIG. 9, segments of the wire of interest LNX shown in FIG. 10 are extracted; examples of these cross-sectional structures are as shown in FIG. 11, FIG. 12, and FIG. 13. The dielectric constant structure surrounding the wire of interest the segments of which are extracted is then simplified to calculate a common dielectric constant (S32).

Figure 15A:
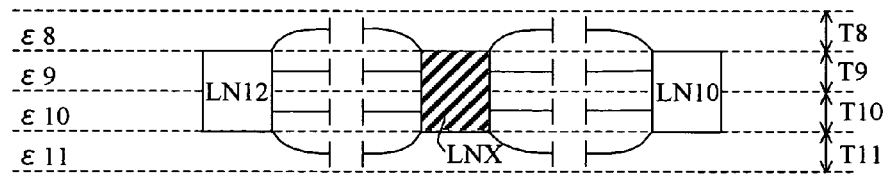
FIG. 15 is a drawing to explain simplification of the dielectric constant structure corresponding to adjacent wire capacitance values.

FIG. 15 is a drawing to explain simplification of the dielectric constant structure corresponding to adjacent wire capacitance values with adjacent wires in the horizontal direction. FIG. 15A shows a portion of a cross-sectional view of segment SG2 in FIG. 11; four insulating film layers, with dielectric constants ∈8, ∈9, ∈10, ∈11 and with film thicknesses T8, T9, T10, T11 exist between and surrounding the adjacent wires LN10 and LN12 on the left and right in the same wiring layer as the wire of interest LNX. In this case, calculation of capacitance values for each of the insulating films means an increase in the number of calculation processes. Hence the common dielectric constant ∈A of the four insulating films is determined by calculation, and the plurality of insulating films are simplified. Specifically, by adding the dielectric constants ∈8, ∈9, ∈10, ∈11 of the four insulating layers according to the ratios of the film thicknesses T8, T9, T10, T11 of the respective insulating films to the total film thickness TA of the four insulating film layers, the common dielectric constant ∈A is obtained. That is, the following calculation equation is used.

$$\in A = \in 8 \times T8/TA + \in 9 \times T9/TA + \in 10 \times T10/TA + \in 11 \times T11/TA$$

Figure 15B:
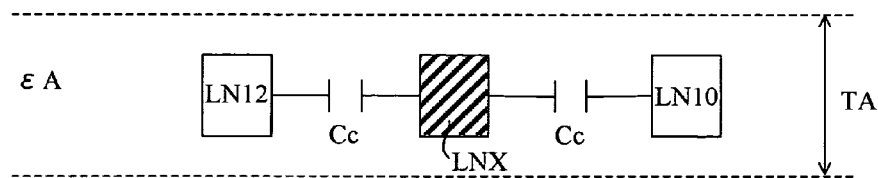

As a result, as shown in FIG. 15B, the areas between and surrounding the wire of interest LNX and adjacent wires LN10, LN12 can be taken to be a single insulating film with the common dielectric constant ∈A. Hence the adjacent wire capacitance Cc can be calculated simply according to this simplified dielectric constant structure (S34). The reason for incorporating the dielectric constants ∈8 and ∈11 of the surrounding area into the common dielectric constant is because of the need, when calculating an adjacent wire capacitance Cc, to include in capacitance calculations not only the dielectric material between wires, but also the dielectric material surrounding both edges of the wires.

FIG. 16 is a drawing to explain another method of simplification of the dielectric constant structure corresponding to adjacent wire capacitance values. FIG. 16A is the same as FIG. 15A. In this example, of the four insulating films, the two insulating film layers between the wire of interest LNX and the adjacent wiring layers are simplified. That is, the dielectric constants ∈9, ∈10 of the two insulating film layers are added according to the ratios of the film thicknesses T9, T10 to the total film thickness TB for the two insulating film layers, to calculate the common dielectric constant ∈B. That is, the following calculation equation is used.

$$\in B = \in 9 \times T9/TB + \in 10 \times T10/TB$$

As a result, as shown in FIG. 16B, the areas between and surrounding the wire of interest LNX and adjacent wires LN10, LN12 can be taken to be a three-layer insulating film with the dielectric constants ∈8, ∈11 and common dielectric constant ∈B. And, the adjacent wire capacitance Cc can be calculated simply according to this simplified dielectric constant structure.

Figure 17A:
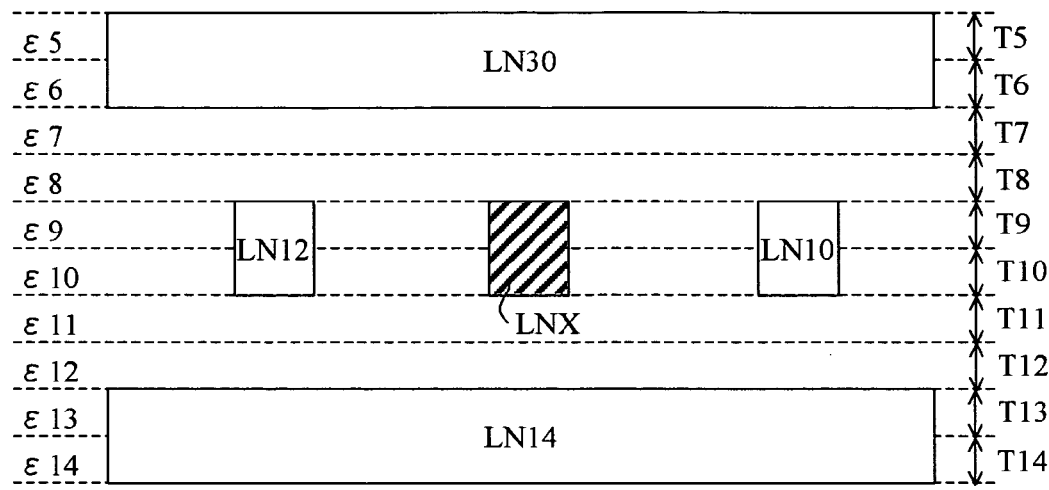
FIG. 17 is a drawing to explain simplification of the dielectric constant structure corresponding to capacitances with wires above and below.

FIG. 17 is a drawing to explain simplification of the dielectric constant structure corresponding to capacitances with vertical-direction wires. FIG. 17A shows a portion of the cross-sectional view of segment SG2 in FIG. 11; there exist six insulating film layers, with dielectric constants ∈7 to ∈12 and film thicknesses T7 to T12, between the wire of interest LNX and the adjacent wires LN14, LN30 above and below. The dielectric constant structure of these six layers is simplified to a single dielectric constant structure, and a common dielectric constant ∈C is calculated. The calculation equation is the same as that above, and the dielectric constants are added according to the ratios of the film thicknesses to the total film thickness TC. That is, $$\in C = \in 7 \times T7/TC + \in 8 \times T8/TC + \in 9 \times T9/TC + \\ \in 10 \times T10/TC + \in 11 \times T11/TC + \\ \in 12 \times T12/TC$$

Figure 17B:
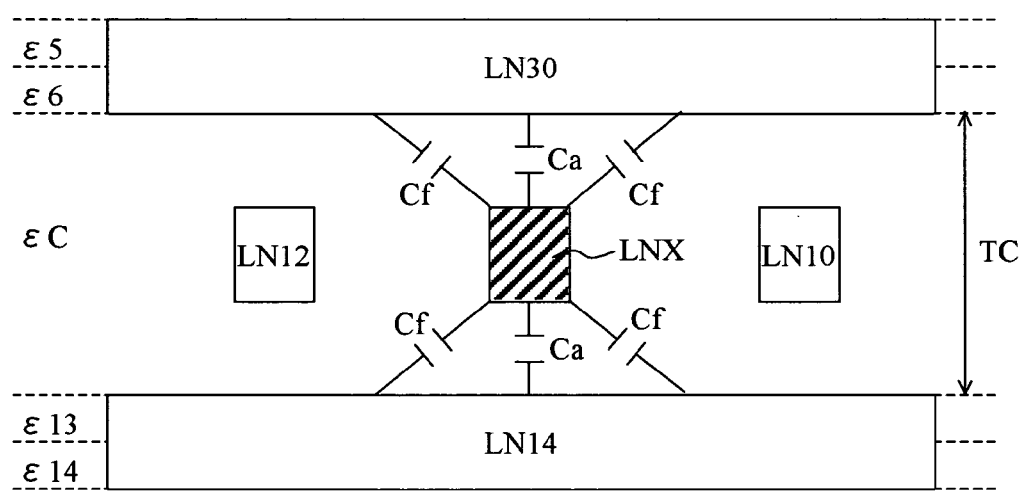

As a result, as shown in FIG. 17B, the area capacitances Ca and fringe capacitances Cf can be calculated simply, according to the simplified dielectric constant structure with common dielectric constant ∈C.

FIG. 18 is a drawing to explain another method of simplification of the dielectric constant structure corresponding to capacitances with vertical-direction adjacent wires. FIG. 18A is the same cross-sectional view as FIG. 17A. In this example, as shown in FIG. 18B, the dielectric constants ∈7, ∈8 are simplified to a common dielectric constant ∈D, the dielectric constants ∈9, ∈10 are simplified to a common dielectric constant ∈E, and the dielectric constants ∈11, ∈12 are simplified to a common dielectric constant ∈F. As a result, as shown in FIG. 18B, a simplified structure with three common dielectric constants ∈D, ∈E, ∈F is obtained. Area capacitances Ca and fringe capacitances Cf can be calculated easily according to this simplified dielectric constant structure. Thus all related dielectric constants may be simplified as a single common dielectric constant, as in FIG. 17, or portions of the dielectric constants may be selected appropriately and simplified into a plurality of common dielectric constants, as in FIG. 18.

Figure 19:
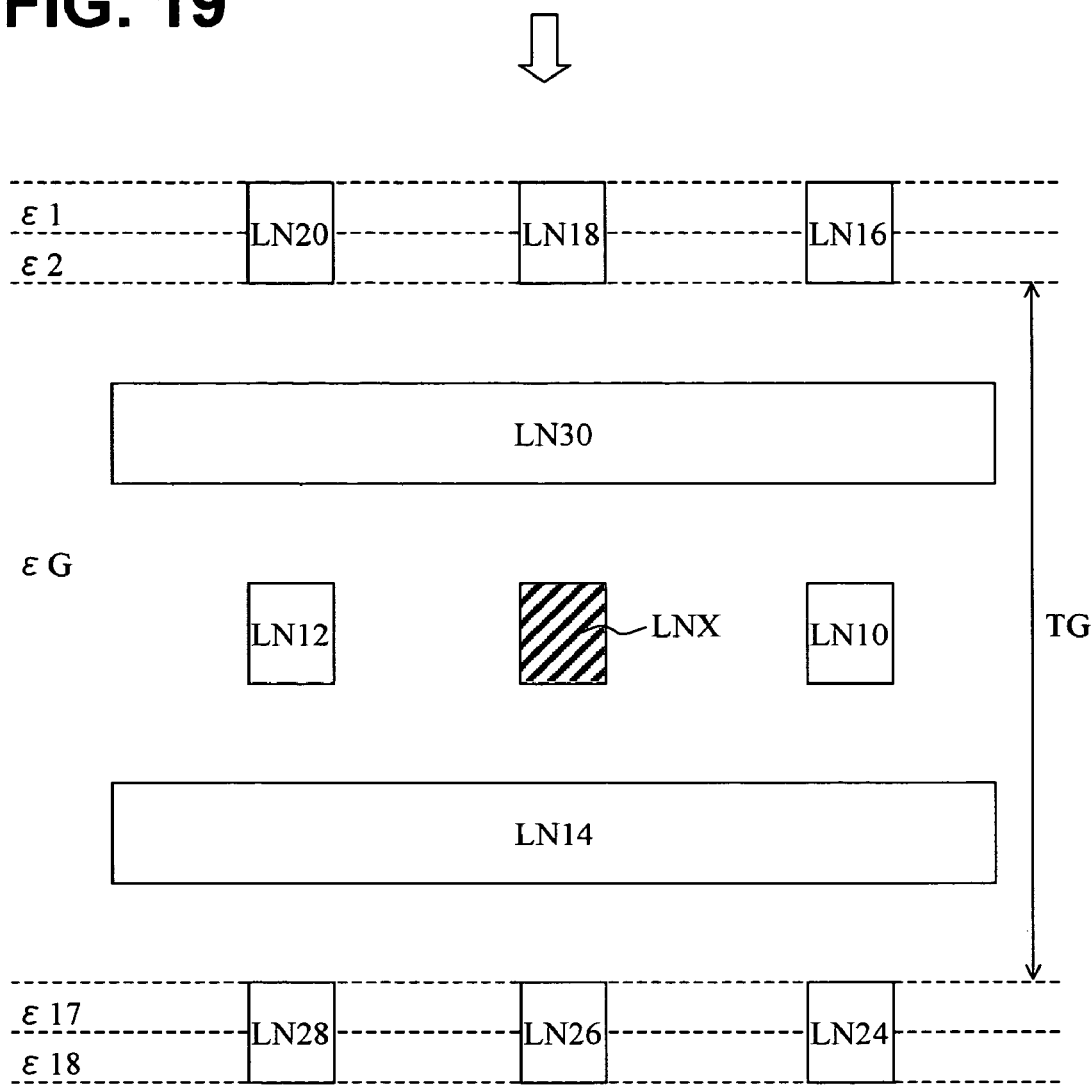
FIG. 19 is a drawing to explain another method of simplification of the dielectric constant structure corresponding to capacitances with wires above and below.

FIG. 19 is a drawing to explain another method of simplification of the dielectric constant structure corresponding to capacitances with vertical-direction adjacent wires. In this example, in segment SG2 of FIG. 11, the dielectric constants ∈3 to ∈16 of 15 are simplified to the common dielectric constant ∈G. That is, the dielectric constants are weighted by the ratio of each film thickness to the entire film thickness TG and added to calculate the common dielectric constant ∈G, in order to calculate the dielectric constant in the vertical direction of the wire of interest LNX.

Figure 20:
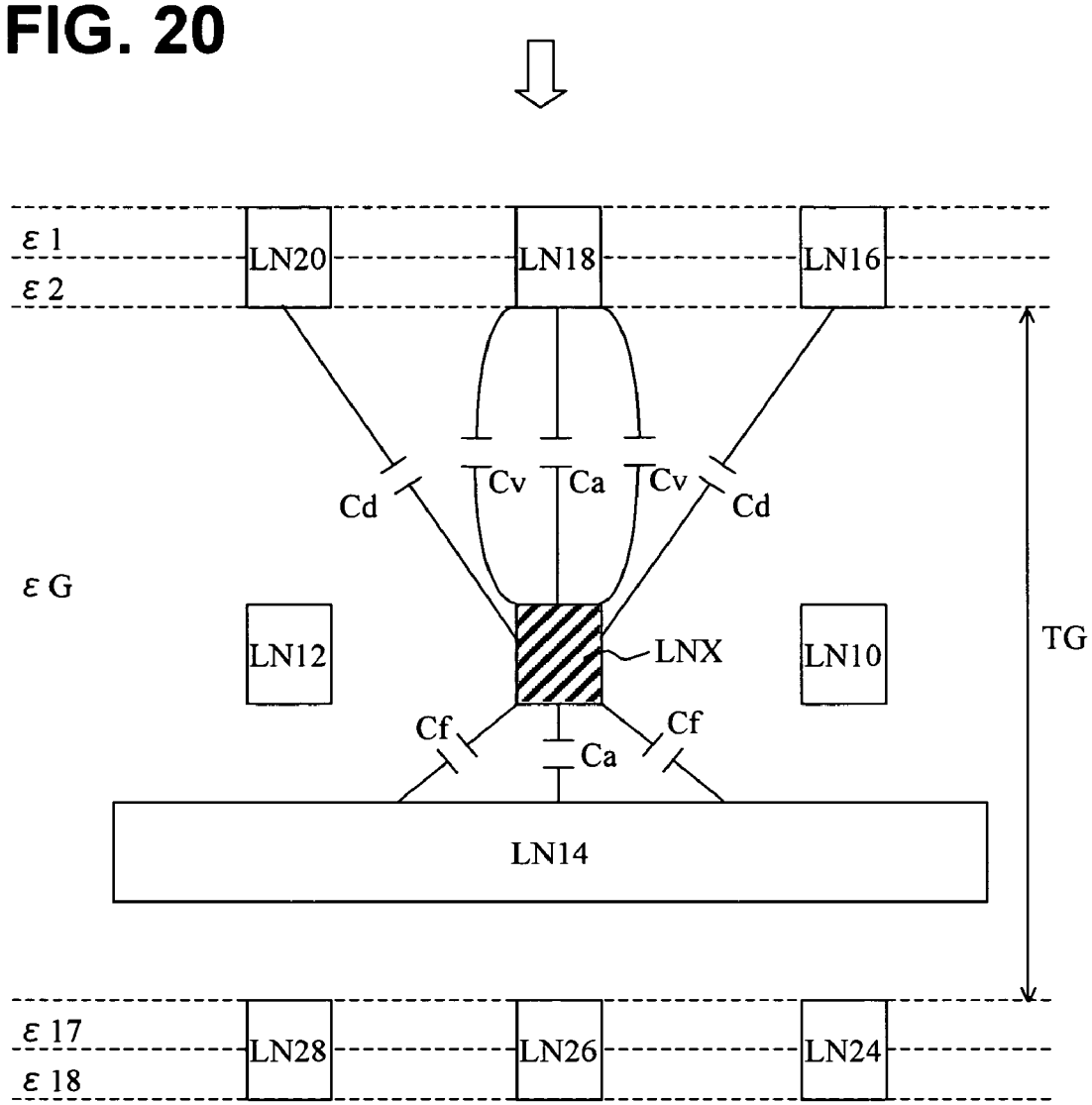
FIG. 20 is a drawing to explain another method of simplification of the dielectric constant structure corresponding to capacitances with wires above and below.

In FIG. 20, the dielectric constant structure is simplified in the cross-sectional structure of the segment SG4 of FIG.

13. In this example, as in FIG. 19, the dielectric constants ∈3 to ∈16 of 15 are simplified to a common dielectric constant ∈G. This common dielectric constant ∈G can be employed to calculate simply the capacitance values Ca, Cf, Cv, Cd shown in FIG. 20. Alternatively in order to calculate each of these capacitance values, at the least it is sufficient to simplify the dielectric constant structure between the wire of interest and the wires LN14 and LN18, and so the common dielectric constant may be calculated for these dielectric constants. If the dielectric constants ∈3 to ∈16 are simplified to a common dielectric constant ∈G similarly to FIG. 19 and FIG. 20, the common dielectric constant ∈G can be used in the cross-sectional structure of the segment SG3 in FIG. 12 as well.

Figure 21:
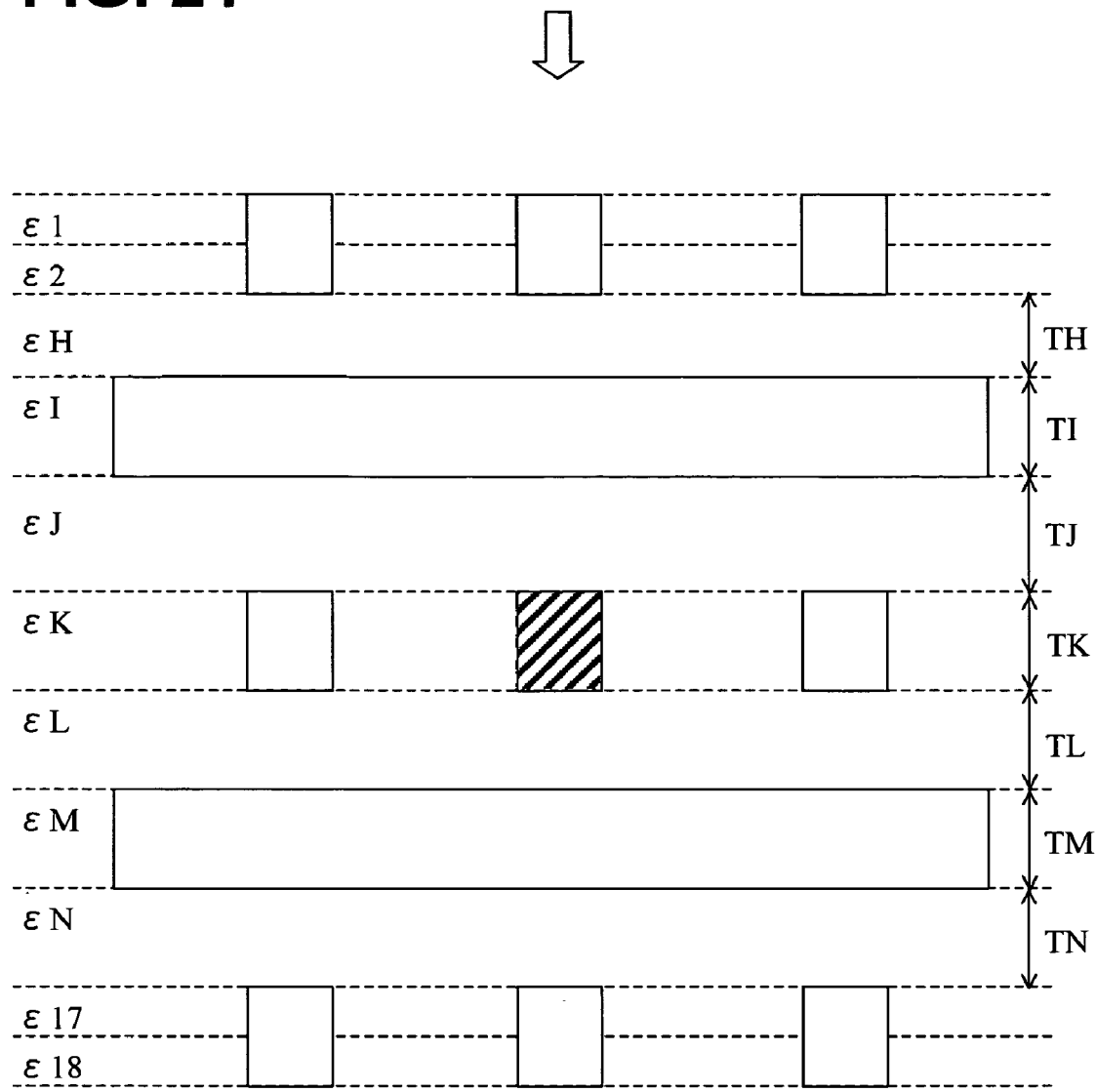
FIG. 21 is a drawing to explain another method of simplification of the dielectric constant structure corresponding to capacitances with wires above and below; and, FIG. 22 is a drawing to explain simplification of the dielectric constant structure when a dummy pattern is provided in a wiring layer.

FIG. 21 shows a plurality of simplified common dielectric constants ∈H, ∈I, ∈J, ∈K, ∈L, ∈M, ∈N in the cross-sectional structure of the segment SG2 in FIG. 11. In this example, a plurality of dielectric constants between adjacent wiring layers and a plurality of dielectric constants within each wiring layer are simplified to common dielectric constants. In this way, simplification to a plurality of common dielectric constants may also be performed as appropriate. That is, a plurality of dielectric constants for simplification may be selected according to the cross-sectional structure of the segment and dielectric constants to be generated, to determine common dielectric constants.

Figure 22A:
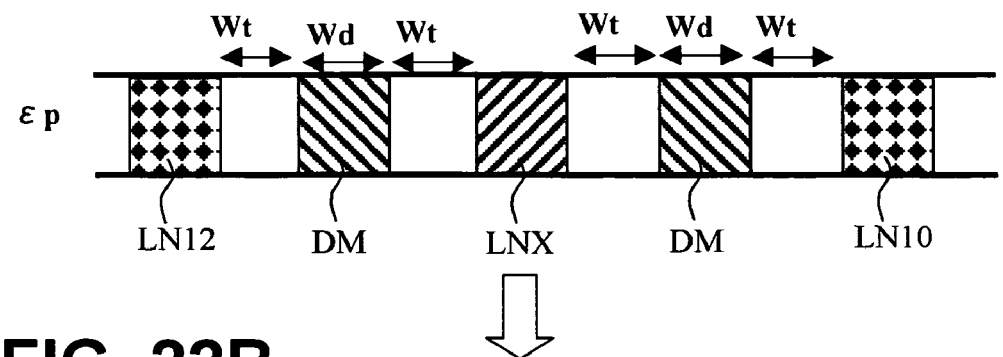
Figure 22B:
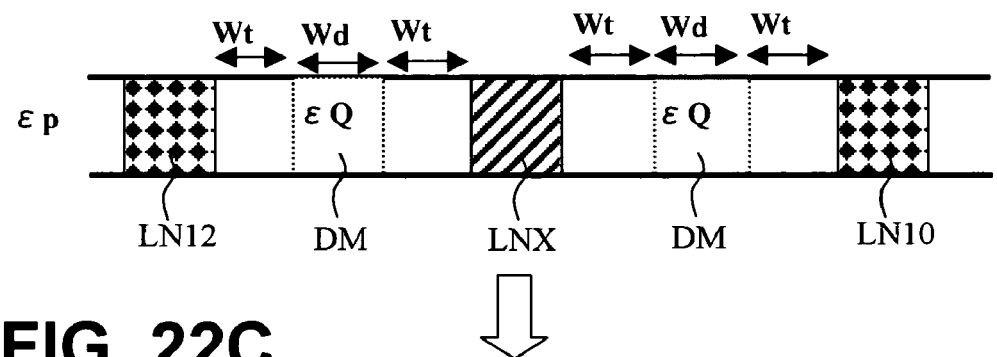
Figure 22C:
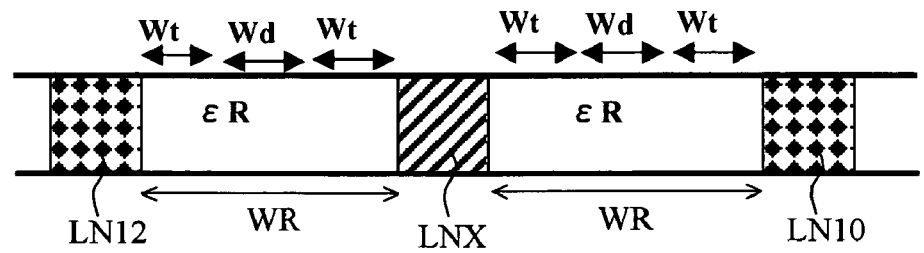

FIG. 22 is a drawing to explain simplification of the dielectric constant structure when a dummy pattern is provided in a wiring layer. As shown in FIG. 22A, a dummy pattern DM with floating potential is provided between wiring layers, to hold the wiring density constant and prevent fluctuations in the wire widths and heights in etching processes and CMP (chemical-mechanical polishing) processes. This dummy pattern is normally formed of the same conductive material as other wiring, so that the distance in the insulating film from the wire of interest LNX to adjacent wires LN10, LN12 is shortened. As a result, the adjacent wire capacitances when a dummy pattern exists are larger than when no such pattern exists. Hence in order to accurately calculate adjacent-wire capacitances, it is necessary to take into account not only the simple distances from adjacent wires, but also the width Wd of a dummy pattern therebetween. Here, then, a comparatively large hypothetical dielectric constant ∈Q is assigned to the dummy pattern DM, and this dummy dielectric constant ∈Q and the insulating film dielectric constant ∈p are simplified to calculate the common dielectric constant ∈R. The common dielectric constant ∈R is calculated by adding the dummy dielectric constant ∈Q and insulating film dielectric constant ∈p, weighted by the ratios of the respective widths Wt, Wd to the distance between wires WR. That is, $$\in R = \in p \times Wt/WR + \in Q \times Wd/WR + \in P \times Wt/WR$$

By employing this common dielectric constant ∈R, adjacent wire capacitances can be calculated simply according to the distance WR between adjacent wiring layers.

The dummy dielectric constant ∈Q is set to an appropriate value in advance such that the capacitance value due to the above common dielectric constant ∈R is equal to the capacitance value calculated assuming the dummy pattern.

Returning to FIG. 14, when the dielectric constant structure of an extracted segment is simplified and a common dielectric constant is calculated (S32), the capacitance C rule table is calculated, using the common dielectric constant, for the segment with that simplified dielectric constant structure (S34). Processing to calculate this rule table requires comparatively little computer processing time because the dielectric constant structure has been simplified. These processes S30, S32 and S34 are repeated for all segments of all possible wiring structures.

The simplification process of FIG. 14 is realized by using a computer, which is a arithmetic unit, to execute the RLC rule creation program shown in FIG. 5.

Rule tables for resistance values R and inductances L are not of particular interest in this aspect; but to explain briefly, these rule tables are generated for each wiring layer by calculating the resistance values R and inductances L per unit area or per unit length according to the material, film thickness, and similar.

As described above, by means of this aspect a plurality of dielectric constant structures in a multilayer wiring structure are simplified, so that a capacitance value rule table for a wire of interest can be calculated simply, and the computer processing time required can be reduced. By using an RLC rule table calculated in this way, RLC values for a wire of interest can be easily extracted by matching parameters.

What is claimed is:

1. A method of generating a capacitance value rule table having, according to parameters including adjacent wire distances, capacitance value data for wires in a multilayer wiring structure in which are provided a plurality of wiring layers in a structure of a plurality of insulating films having different dielectric constants, said method comprising:
    a step of extracting data of an adjacent wiring structure for a wire of interest;
    a common dielectric constant generation step of calculating a common dielectric constant for the plurality of insulating films included in said adjacent wiring structure, by adding the dielectric constants of the plurality of insulating films according to thickness of the respective insulating film; and,
    a step of generating said capacitance value rule table by calculating capacitance value data corresponding to said parameters according to the calculated common dielectric constant.

2. The method of generating a capacitance value rule table according to claim 1, wherein in said common dielectric constant generation step, the dielectric constants of said plurality of insulating films are added according to ratios of the thickness of the respective insulating film to total film thickness of said plurality of insulating films.

3. The method of generating a capacitance value rule table according to claim 1, wherein in said step of extracting data of an adjacent wiring structure, said data is extracted for the plurality of insulating films existing between said wire of interest and wires laterally or vertically adjacent thereto.

4. The method of generating a capacitance value rule table according to claim 1, wherein in said common dielectric constant generation step, common dielectric constants are respectively calculated for a plurality of insulating film groups included in said adjacent wiring structure.

5. A method of generating a capacitance value rule table having, according to parameters including adjacent wire distances, capacitance value data for wires in a wiring structure in which are provided plurality of wires in an insulating film structure, wherein said wiring structure has a floating dummy pattern between adjacent wires in a horizontal direction; said method comprises:
    a step of extracting data of an adjacent wiring structure for a wire of interest;
    a common dielectric constant generation step of calculating a common dielectric constant for areas between said adjacent wires in the horizontal direction included in said adjacent wiring structure, by adding dielectric constants of insulating films and dummy dielectric constant assigned to said floating dummy pattern according to widths of said insulating films and said floating dummy pattern; and a step of generating said capacitance value rule table by calculating capacitance value data corresponding to said parameters according to the calculated common dielectric constant.

6. The method of generating a capacitance value rule table according to claim 5, wherein in said common dielectric constant generation step, the dielectric constants of said insulating films and said dummy dielectric constant are added according to ratios of the widths of each of the insulating films and the floating dummy pattern to total widths of said insulating films and said floating dummy pattern.

7. A capacitance value rule table generation program for causing a computer to execute a procedure to generate a capacitance value rule table having, according to parameters including adjacent wire distances, capacitance value data for wires in a multilayer wiring structure in which are provided plurality of wiring layers in a structure of a plurality of insulating films having different dielectric constants, said procedure comprising:

a procedure of causing the computer to extract data of an adjacent wiring structure for a wire of interest;

a common dielectric constant generation procedure of causing the computer to calculate a common dielectric constant for a plurality of insulating films included in said adjacent wiring structure, by adding the dielectric constants of the plurality of insulating films according to thickness of each insulating film; and a procedure of causing the computer to generate said capacitance value rule table by calculating capacitance value data corresponding to said parameters according the calculated common dielectric constant.

8. The capacitance value rule generation program according to claim 7, wherein in said common dielectric constant generation procedure, said common dielectric constant is calculated by adding the dielectric constants of said plurality of insulating films according to ratios of the thickness of respective insulating film to total film thickness of said plurality of insulating films.

9. A capacitance value rule table generation program for causing a computer to execute a procedure to generate a capacitance value rule table having, according to parameters including adjacent wire distances, capacitance value data for wires in a wiring structure in which are provided plurality of wires in an insulating film structure, wherein said wiring structure has a floating dummy pattern between adjacent wires in a horizontal direction; said procedure comprises:

a procedure of causing the computer to extract data of an adjacent wiring structure for a wire of interest;

a common dielectric constant generation procedure of causing the computer to calculate a common dielectric constant for areas between said adjacent wires in the horizontal direction included in said adjacent wiring structure, by adding dielectric constants of insulating films and dummy dielectric constant assigned to said floating dummy pattern according to widths of said insulating films and said floating dummy pattern; and a procedure of causing the computer to generate said capacitance value rule table by calculating capacitance value data corresponding to said parameters according to the calculated common dielectric constant.

10. An integrated circuit logic verification method for performing logic verification of an integrated circuit by referencing a capacitance value rule table having, according to parameters including adjacent wire distances, capacitance value data for wires in a multilayer wiring structure in which are provided plurality of wiring layers in a structure of a plurality of insulating films having different dielectric constants, said method comprising:

a step of extracting data of an adjacent wiring structure for a wire of interest;

a common dielectric constant generation step of calculating a common dielectric constant for a plurality of insulating films included in said adjacent wiring structure, by adding the dielectric constants of the plurality of insulating films according to thickness of each insulating film;

a step of generating said capacitance value rule table by calculating capacitance value data corresponding to said parameters according the calculated common dielectric constant; and a logic verification step of referencing said generated capacitance value rule table to perform logic verification of said integrated circuit.

11. An integrated circuit logic verification method for performing logic verification of an integrated circuit by referencing a capacitance value rule table having, according to parameters including adjacent wire distances, capacitance value data for wires in a wiring structure in which are provided plurality of wires in an insulating film structure, wherein:

said wiring structure has a floating dummy pattern between adjacent wires in a horizontal direction; and said method comprises:

a step of extracting data of an adjacent wiring structure for a wire of interest;

a common dielectric constant generation step of calculating a common dielectric constant for areas between said adjacent wires in the horizontal direction included in said adjacent wiring structure, by adding dielectric constants of insulating films and dummy dielectric constant assigned to said floating dummy pattern according to widths of said insulating films and said floating dummy pattern;

a step of generating said capacitance value rule table by calculating capacitance value data corresponding to said parameters according to the calculated common dielectric constant; and a logic verification step of referencing said generated capacitance value rule table to perform logic verification of said integrated circuit.

12. An integrated circuit logic verification program for causing a computer to execute a procedure to perform logic verification of an integrated circuit by referencing a capacitance value rule table having, according to parameters including adjacent wire distances, capacitance value data for wires in a multilayer wiring structure in which are provided plurality of wiring layers in a structure of a plurality of insulating films having different dielectric constants, said procedure comprising:

a procedure of causing the computer to extract data of an adjacent wiring structure for a wire of interest;

a common dielectric constant generation procedure of causing the computer to calculate a common dielectric constant for a plurality of insulating films included in said adjacent wiring structure, by adding the dielectric constants of the plurality of insulating films according to thickness of each insulating film;

a procedure of causing the computer to generate said capacitance value rule table by calculating capacitance value data corresponding to said parameters according to the calculated common dielectric constant; and a logic verification procedure of causing the computer to reference said generated capacitance value rule table to perform logic verification of said integrated circuit.

13. An integrated circuit logic verification program for causing a computer to execute a procedure to perform logic verification of an integrated circuit by referencing a capacitance value rule table having, according to parameters including adjacent wire distances, capacitance value data for wires in a wiring structure in which are provided plurality of wires in an insulating film structure, wherein said wiring structure has a floating dummy pattern between adjacent wires in a horizontal direction; said procedure comprises:

a procedure of causing the computer to extract data of an adjacent wiring structure for a wire of interest;

a common dielectric constant generation procedure of causing the computer to calculate a common dielectric constant for areas between said adjacent wires in the horizontal direction included in said adjacent wiring structure, by adding dielectric constants of insulating films and dummy dielectric constant assigned to said floating dummy pattern according to widths of said insulating films and said floating dummy pattern;

a procedure of causing the computer to generate said capacitance value rule table by calculating capacitance value data corresponding to said parameters according to the calculated common dielectric constant; and a logic verification procedure of causing the computer to reference said generated capacitance value rule table to perform logic verification of said integrated circuit.

* * * * *

UNITED STATES PATENT AND TRADEMARK OFFICE
CERTIFICATE OF CORRECTION

| | | |
|---|---|---|
| PATENT NO. | : 7,228,512 B2 | Page 1 of 1 |
| APPLICATION NO. | : 10/898982 | |
| DATED | : June 5, 2007 | |
| INVENTOR(S) | : Hisayoshi Ohba et al. | |

It is certified that error appears in the above-identified patent and that said Letters Patent is hereby corrected as shown below:

Column 12, Line 33, change "and," to --and--.

Column 12, Line 57, after "provided" insert --a--.

Column 13, Line 20, before "plurality of wiring" insert --a--.

Column 13, Line 46, after "provided" insert --a--.

Column 14, Line 2, after "provided" insert --a--.

Column 14, Line 25, after "provided" insert --a--.

Column 14, Line 52, before "plurality of wiring" insert --a--.

Column 15, Line 9, after "provided" insert --a--.

Signed and Sealed this

Thirteenth Day of November, 2007

JON W. DUDAS
*Director of the United States Patent and Trademark Office*